United States Patent

Koshimizu

[11] Patent Number: 5,980,687
[45] Date of Patent: Nov. 9, 1999

[54] PLASMA PROCESSING APPARATUS COMPRISING A COMPENSATING-PROCESS-GAS SUPPLY MEANS IN SYNCHRONISM WITH A ROTATING MAGNETIC FIELD

[75] Inventor: Chishio Koshimizu, Yamanashi-ken, Japan

[73] Assignee: Tokyo Electron Limited, Tokyo, Japan

[21] Appl. No.: 09/066,736

[22] Filed: Apr. 27, 1998

[30] Foreign Application Priority Data

May 20, 1997 [JP] Japan .................................. 9-144563

[51] Int. Cl.$^6$ ............................. C23F 1/02; C23C 14/00; C23C 16/00
[52] U.S. Cl. .............. 156/345; 204/298.07; 204/298.31; 204/298.33; 204/298.37; 204/192.12; 204/192.32; 204/298.16; 118/715; 118/723 R; 118/723 E; 118/723 MP
[58] Field of Search ....................... 156/345; 204/298.31, 204/298.33, 298.34, 298.37, 298.07, 298.16, 298.2, 192.12, 192.32; 118/723 MW, 723 MR, 723 MA, 715, 723 R, 723 E

[56] References Cited

U.S. PATENT DOCUMENTS

| | | | |
|---|---|---|---|
| 4,392,915 | 7/1983 | Zajac | 156/345 |
| 4,529,474 | 7/1985 | Fujiyama et al. | 156/345 |
| 4,668,338 | 5/1987 | Maydan et al. | 204/298.37 |
| 4,668,365 | 5/1987 | Foster et al. | 204/298.37 |
| 4,734,621 | 3/1988 | Yonnet et al. | 204/298.37 |
| 4,963,242 | 10/1990 | Sato et al. | 204/298.31 |
| 5,110,437 | 5/1992 | Yamada et al. | 204/298.33 |
| 5,304,250 | 4/1994 | Sameshima et al. | 156/345 |
| 5,431,769 | 7/1995 | Kisakibaru et al. | 204/298.37 |
| 5,556,501 | 9/1996 | Collins et al. | 156/345 |
| 5,693,238 | 12/1997 | Schmitt et al. | 156/345 |
| 5,704,981 | 1/1998 | Kawakami et al. | 156/345 |
| 5,747,362 | 5/1998 | Visser | 204/298.07 |
| 5,792,261 | 8/1998 | Hama et al. | 156/345 |
| 5,824,607 | 10/1998 | Trow et al. | 156/345 |
| 5,837,093 | 11/1998 | Hasegawa et al. | 156/345 |
| 5,874,706 | 2/1999 | Ishii et al. | 156/345 |

FOREIGN PATENT DOCUMENTS

| | | |
|---|---|---|
| 63-42707 | 8/1988 | Japan . |
| 1-258428 | 10/1989 | Japan . |
| 3-203317 | 9/1991 | Japan . |
| 3-224224 | 10/1991 | Japan . |
| 4-38132 | 6/1992 | Japan . |

*Primary Examiner*—Nam Nguyen
*Assistant Examiner*—Gregg Cantelmo
*Attorney, Agent, or Firm*—Oblon, Spivak, McClelland, Maier & Neustadt, P.C.

[57] ABSTRACT

A plasma process apparatus includes first and second electrodes or susceptors located in a process container with a space interposed therebetween, first and second electrodes being disposed to support a semiconductor wafer such that the wafers are opposed to each other through a plasma a generating region. A high frequency voltages are applied to the first and second electrodes to supply a high frequency power to the plasma generating region, and a rotating magnetic field is generated in the plasma generating region, so that the high frequency power and the rotating magnetic field generate plasma of a process gas in the plasma generating region. Compensating-process-gas supply mechanism is provided for supplying a compensating process gas to part of the plasma generating region in synchronism with the rotation of the rotating magnetic field to compensate non-uniformity in the density of plasma generated in the plasma generating region.

8 Claims, 4 Drawing Sheets

PLASMA PROCESSING APPARATUS COMPRISING A COMPENSATING-PROCESS-GAS SUPPLY MEANS IN SYNCHRONISM WITH A ROTATING MAGNETIC FIELD

BACKGROUND OF THE INVENTION

This invention relates to a plasma process apparatus for generating plasma of a process gas to perform etching, ashing, film forming, etc. of a to-be-treated object such as a semiconductor wafer.

An etching apparatus has been proposed in which upper and lower electrodes are opposed to each other within a process chamber defined in an airtight process container. In this apparatus, after a to-be-treated object, for example, a semiconductor wafer is fixed on a mount surface or upper surface of the lower electrode, a predetermined process gas is introduced into the process chamber, and a predetermined high frequency power is applied to each of the upper and lower electrodes to excite the process gas into plasma, thereby performing predetermined etching of the object.

Japanese Patent Application KOKAI Publication No. 4-38132, for example, has recently proposed an etching apparatus in which mount surfaces are formed at both the upper and lower electrodes for fixing to-be-etched objects thereon. This apparatus can treat two or more objects simultaneously, which means that it can achieve a high throughput.

In the etching apparatus in which the mount surface is provided on the lower electrode only, that surface of the upper electrode which is opposed to the lower electrode is exposed to the atmosphere of plasma and hence easily etched during the etching process. Accordingly, the upper electrode must be exchanged with a new one in a relatively short time, which inevitably leads to an increase in the operation cost of the etching apparatus and to a reduction in throughput due to a time loss during the exchange.

On the other hand, in the etching apparatus in which both the upper and lower electrodes have their respective mount surfaces, those surfaces of the electrodes which are opposed to each other are covered with to-be-treated objects mounted thereon during the etching process, and therefore not easily etched. Therefore, the time of electrode exchange can be prolonged. Moreover, since in this apparatus, two objects can be simultaneously treated as aforementioned, it can realize a high throughput. However, to generate uniform plasma near the objects fixed on the mount surfaces has been very difficult so far. It is now considered one of the to-be-overcome technical matters to generate uniform plasma near the to-be-treated surface of each object and apply plasma of a desired state to the to-be-treated surface, in order to perform a desired uniform process of it.

BRIEF SUMMARY OF THE INVENTION

It is an object of the invention to provide a plasma process apparatus capable of treating a to-be-treated object supported by an electrode, using desired uniform plasma, and achieving a high throughput.

It is another object of the invention to provide a plasma process apparatus capable of treating, using desired uniform plasma, each of to-be-treated objects supported by electrodes opposed to each other with a predetermined space therebetween, and achieving a high throughput.

According to an aspect of the invention, there is provided a plasma process apparatus comprising:

a process container having a bottom wall, an upper wall, and a peripheral wall located between the bottom and upper walls;

first and second electrodes located in the process container with a predetermined space interposed therebetween, a plasma generating region being defined between the first and second electrodes, at least one of the first and second electrodes being disposed to support a to-be-treated object such that the object is opposed to the other electrode;

means for supplying a process gas to the plasma generating region;

means for applying a high frequency voltage to at least one of the first and second electrodes to supply a high frequency power to the plasma generating region;

means for generating a rotating magnetic field in the plasma generating region, the high frequency power and the rotating magnetic field generating plasma of the process gas in the plasma generating region; and compensating-process-gas supply means for supplying a compensating process gas to part of the plasma generating region in synchronism with rotation of the rotating magnetic field, so as to compensate nonuniformity in the density of plasma generated in the plasma generating region.

Since in the above structure, the compensating process gas is supplied from the peripheral wall side of the process chamber to part of the plasma generating region to compensate nonuniformity in plasma density, treatments such as etching, ashing, film forming, etc. can be performed uniformly all over the to-be-treated object.

Preferably, the first and second electrodes support to-be-treated objects such that the objects are opposed to each other, and the compensating-process-gas supply means has a gas supply mechanism for supplying the compensating process gas between the objects, preferably to a substantially center point between the objects.

Since in this structure, a plurality of to-be-treated objects can be simultaneously and uniformly treated and the etching of the electrodes can be minimized, the apparatus can achieve a high throughput.

Preferably, the compensating process gas is supplied to the plasma generating region, in synchronism with the rotation of the rotating magnetic field, sequentially through multiple gas discharge holes fixedly provided around the plasma generating region. Alternatively, the compensating process gas is supplied to the plasma generating region continuously through one or a small number of gas discharge holes which revolve around the plasma generating region in synchronism with the rotation of the rotating magnetic field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
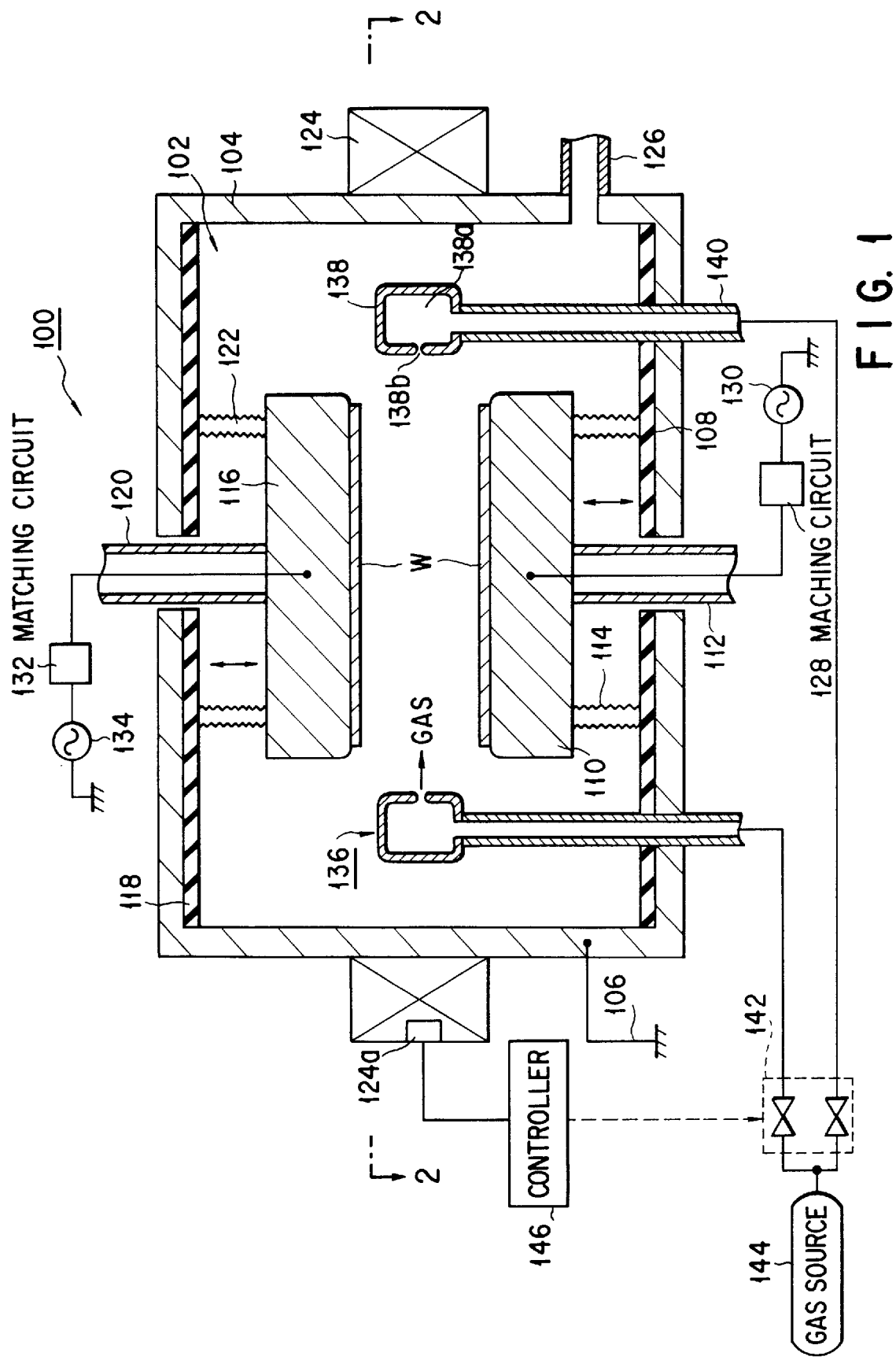
FIG. 1 is a sectional view, schematically showing an etching apparatus according to an embodiment of the invention.

Plasma process apparatuses according to the embodiments of the invention, in which they are applied to etching apparatuses, will be described in detail with reference to the accompanying drawings. In the description below, duplicate explanation is omitted by denoting, with the same reference numeral, structural elements which have substantially the same function and structure.

First, an etching apparatus 100 according to a first embodiment of the invention will be described. In FIG. 1, a process chamber 102 incorporated in the etching apparatus 100 is defined in an airtightly openable/closable cylindrical process container 104 made of a conductive metal such as aluminum. The process container 104 is earthed via an earthing wire 106. A substantially cylindrical first susceptor 110 which constitutes a lower electrode is located on an insulating support plate 108 provided on the substantially entire inner surface of the bottom wall of the process container 104, such that it is electrically isolated from the process container. Instead of providing the insulating support plate 108 as described above, the structure may be modified such that an insulating member (not shown) which divides the first susceptor 110 into upper and lower portions electrically isolated from each other is provided in the susceptor 110, or such that both the insulating support plate 108 and the insulating member of the susceptor are employed.

The first susceptor 110 is formed of a conductive material such as aluminum, and has an upper surface or mount surface on which a to-be-treated object, e.g. a semiconductor wafer (hereinafter referred to simply as "wafer") W can be mounted or supported. The first susceptor 110 is supported by the upper end of a vertically movable shaft 112 which movably extends through a hole formed in a center portion of the bottom wall of the insulating support plate 108 and the process chamber 102. The vertically movable shaft 112 is connected to a driving mechanism (not shown) outside the process container, such that it is selectively moved in the vertical direction by the mechanism thereby to vertically move the first susceptor 110. A bellows 114 is provided around the vertically movable shaft 112. The bellows 114 has its upper and lower ends airtightly connected to the lower surface of the first susceptor 110 and the upper surface of the insulating support plate 108, respectively. Accordingly, the space in the process chamber, in which plasma is generated, is airtightly isolated from the outside, irrespective of the hole through which the vertically movable shaft which supports the first susceptor 110 extends.

The first susceptor 110 contains a temperature adjusting mechanism (not shown), such as a heater for heating it and/or a water cooling jacket for cooling it. As a result, the wafer W fixed on the first susceptor 110 can be kept at a predetermined temperature. Cramp means such as an electrostatic chuck or a mechanical cramp (not shown) is provided on the wafer-mounting or—supporting surface of the first susceptor 110 for enabling the wafer W to be fixed on the susceptor in a desired state. A substantially annular focus ring (not shown) made of an insulating material is provided on an outer edge portion of the mount surface of the susceptor 110, so that it can surround the wafer W and effectively apply plasma to it.

A second susceptor 116 which constitutes an upper electrode and can fix a wafer W thereon is opposed to the mount surface of the first susceptor 110 with a predetermined space therebetween. The second susceptor 116 has substantially the same shape as the first susceptor 110 and is made of substantially the same material as it. The second susceptor 116 is insulated from the process container 104 by means of an insulating support plate 118 provided on the substantially entire inner surface of the upper wall of the container 104. Like the first susceptor 110, the second susceptor 116 is vertically movably supported by a vertically movable shaft 120 connected to a driving mechanism (not shown) outside the container 104. Further, the process chamber is airtightly sealed by a bellows 122.

On the outer peripheral surface of the cylindrical wall of the process container 104, there is provided a magnetic field generating mechanism 124 which comprises a plurality of permanent magnets arranged annular and having a predetermined polarity which enables generation of a magnetic field parallel to the upper surface of the wafer, and a driving mechanism for revolving the magnets around the container 104. The magnetic field generating mechanism 124 generates a rotational magnetic field which rotates about the vertical center axis of the process container 104 or of the wafer W, in a plasma generating region defined between both the susceptors. This magnetic field generating mechanism is disclosed in, for example, U.S. application Ser. No. 08/928,026, which is incorporated herein by reference.

An exhaust pipe 126, which is connected to a vacuum pump mechanism (not shown), is connected to a lower portion of the cylindrical wall of the process container 104. Accordingly, the pressure in the process chamber 102 can be reduced to a negative value and kept at the value by operating the vacuum pump mechanism.

A high frequency power supply system for the etching apparatus 100 will now be described. A high frequency power source 130 is electrically connected to the first susceptor 110 via a matching circuit 128. On the other hand, a high frequency power source 134 is electrically connected to the second susceptor 110 via a matching circuit 132. Thus, predetermined high frequency powers are, preferably the same high frequency power is, applied to the first and second susceptors 110 and 116, respectively. A single high frequency power source commonly connected to both the susceptors may be employed instead of the two high frequency powers sources. Such a single-power source case is disclosed in Japanese Patent Application KOKAI Publication No. 4-38132.

Figure 2:
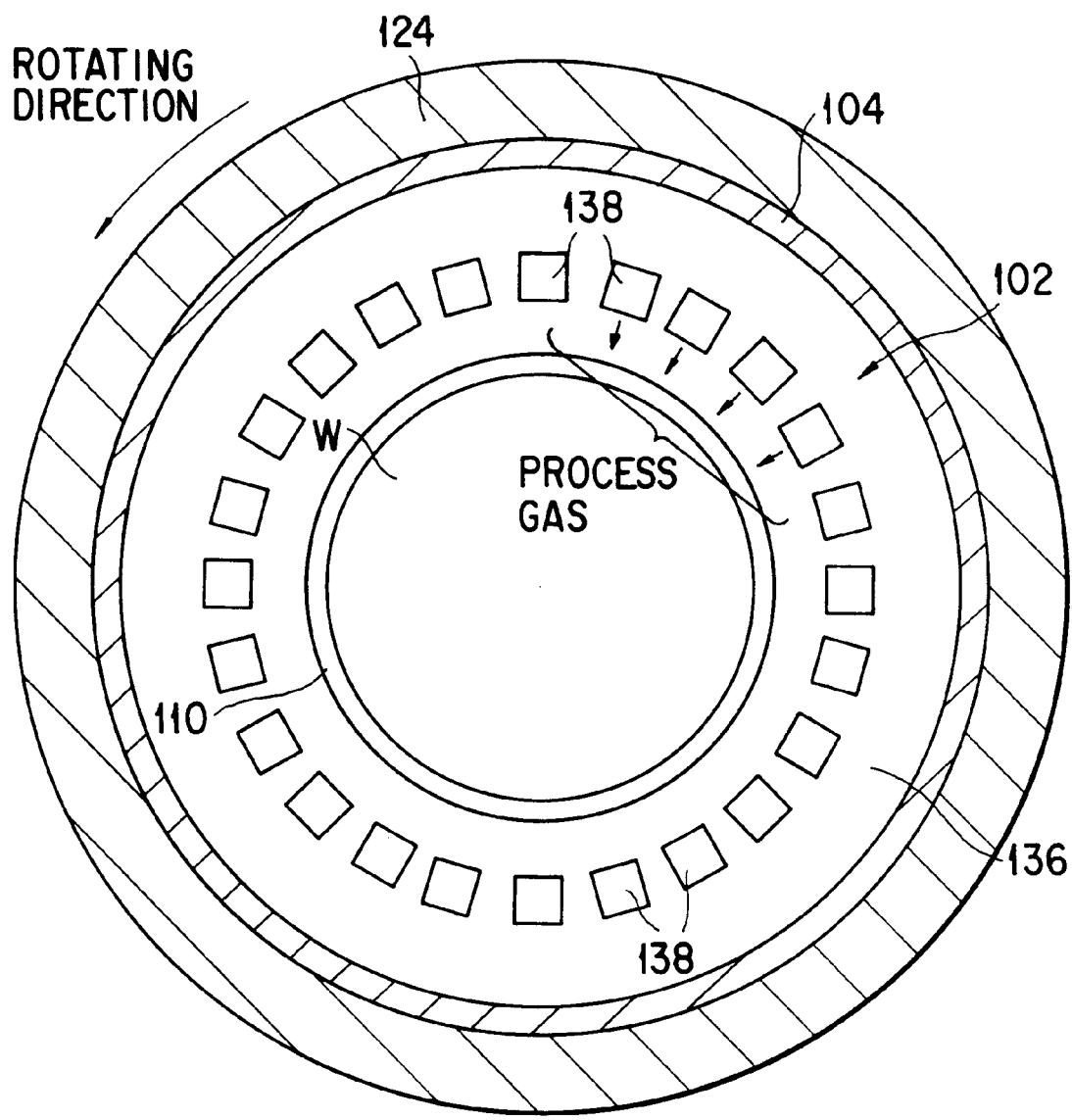
FIG. 2 is a sectional view, taken along lines 2—2 of FIG. 1.

A compensation gas supply mechanism 136 incorporated in the first embodiment will be described in detail. As is shown in FIG. 2, the mechanism 136 comprises a plurality of multiple gas supply members 138 arranged at circumferentially regular intervals such that they surround a plasma generating region defined between the first and second susceptors 110 and 116. As is shown in FIG. 1, each gas supply member 138 has a small-diameter gas supply pipe 140 extending into the process chamber 102 through the bottom wall of the process container 104 and the insulating support plate 108, and a rectangular gas charge member or box 138a supported by the upper end of the supply pipe 140 and defining therein a large-diameter gas charge chamber which communicates with the supply pipe 140. The gas supply pipe 140 is fixed to the container 104 at its middle portion and has a lower end extending to the outside of the container 104. A small-diameter gas discharge hole 138b which connects the interior spaces of the gas charge chamber and the process chamber 102 is formed in a side wall of the gas charge member 138a close to the plasma generating region. Preferably, the gas discharge hole 138b is situated at a vertically middle point between the first and second susceptors 110 and 116. The gas supply pipes 140 are each connected to a gas supply source 144 via a piezoelectric valve 142 which can selectively switch plural valve units. Thus, gas can be selectively supplied from the gas supply source 144 to one or more desired pipes of all gas supply pipes 140.

The piezoelectric valve 142 is operably connected to a controller 146. The controller 146 is also connected to an encoder 124a provided in the magnetic field generating mechanism 124. The encoder 124a detects the revoluntionary position or speed of each permanent magnet or the magnet array and sends the detection result or revolution information to the controller 146. The controller 146 performs opening/closing control of the piezoelectric valve 142 on the basis of the revolution information, thereby sequentially supplying the etching gas from one or more gas supply members 138 to the plasma generating space in synchronism with the rotation of the permanent magnets, i.e. the rotation of the magnetic field.

The etching gas supplied to the plasma generating space is ionized by the magnetic field and the high frequency power, whereby plasma is generated. A wafer (including a layer or layers formed thereon, such as a metallic layer, an insulating layer, etc.) placed in the plasma space is etched by products (inactive particles, active particles, radicals, ions, etc.) which constitute plasma and/or is generated by plasma.

A process-gas discharge mechanism incorporated in the compensation gas supply mechanism 136, which is used to perform etching mainly using ions, will be described in more detail. As described above, the etching apparatus 100 according to the first embodiment is constructed as a magnetron-type etching apparatus equipped with the magnetic field generating mechanism 124. In this apparatus, the electric field generated in the plasma generating region is made to intersect with a magnetic field generated in the same region by the magnetic field generating mechanism or means 124, thereby causing cyclotronic movement of electrons in the plasma in a direction (E×B) perpendicular to the plane formed by the electric field (E) and the magnetic field (B). The electrons which perform cyclotronic movement collide with molecules of the process gas at high frequency, thereby generating plasma of high density. As a result, wafers W can be etched at a high selective ratio and etching rate.

Since as aforementioned, the electrons in the plasma move in the (E×B) direction, the density of plasma increases in the (E×B) direction. This means that the plasma density is ununiform in the plasma generating region, and that it is difficult to perform a uniform etching of the wafer. To generate uniform plasma all over the plasma generating region, the magnetic field generating mechanism 124 is rotated in this apparatus to rotate the magnetic field in the plasma generating region. However, even when the magnetic field is rotated in the plasma generating region, it is not easy to eliminate the state that the plasma density increases in the (E×B) direction.

In light of this, in the first embodiment, the etching gas is locally supplied from the compensation gas supply mechanism 136 to the plasma generating region in synchronism with the rotation of the magnetic field generating mechanism 124. More specifically, the etching gas is discharged through the gas supply member or members 138 located in the (E×B) direction by controlling the piezoelectric valve 142 in synchronism with the rotation of the mechanism 124. As a result, the etching gas is supplied to the part of the peripheral portion of the plasma generating region in a direction opposite to the (E×B) direction, and hence the plasma of high density existing in the direction is diluted, thereby averaging the plasma density all over the plasma generating region.

In this embodiment, the compensation gas supply mechanism 136 also serves as a supply mechanism for supplying gas necessary to initiate plasma generation. Therefore, the controller 146 controls to open the valve 142 before the magnetic field generating mechanism or means 124 is rotated, so as to supply the process chamber with gas necessary for plasma generation.

The compensation gas supply mechanism 136 incorporated in the first embodiment is constructed as above, and can supply a process gas such as an etching gas directly to that portion of the plasma generating region which has an especially high plasma density. As a result, uniform plasma can be generated all over the plasma generating region, and hence wafers W can be uniformly etched at a high selective ratio and etching rate. Moreover, in the etching apparatus 100, wafers W fixed on the first and second susceptors 110 and 116 can simultaneously be subjected to the same etching process, thereby increasing the throughput of the apparatus.

Figure 3:
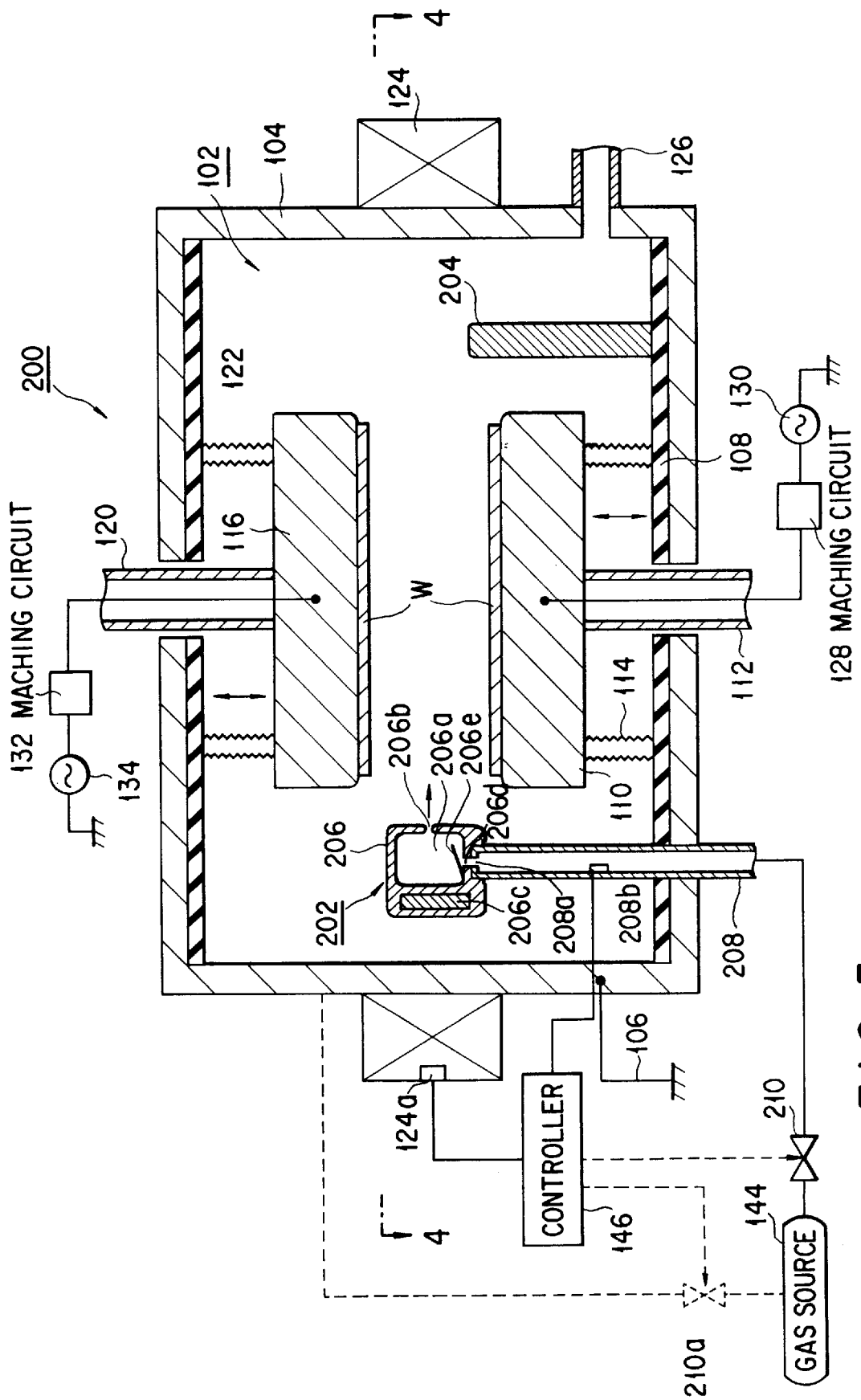
FIG. 3 is a sectional view, schematically showing an etching apparatus according to another embodiment of the invention.
Figure 4:
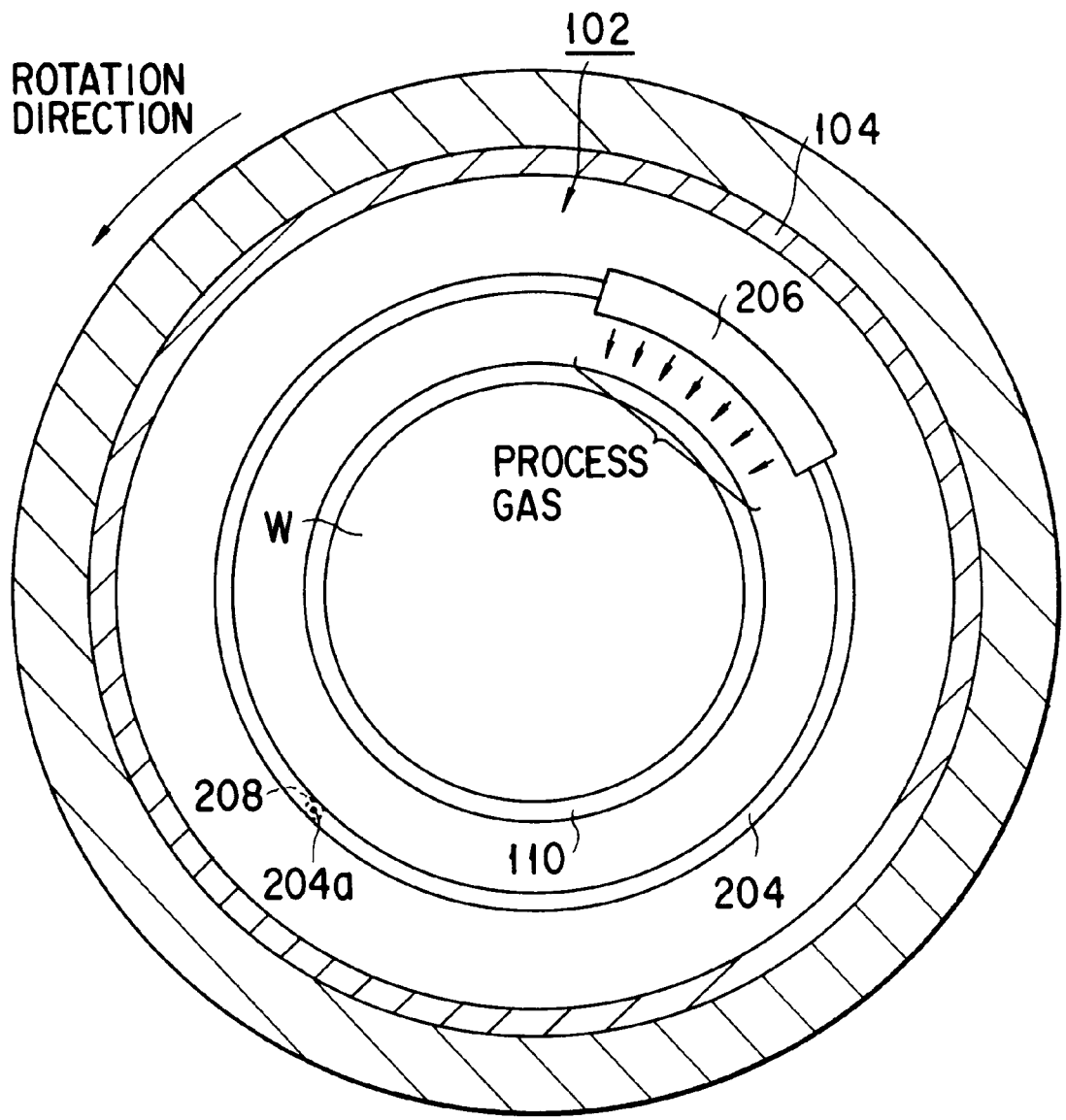
FIG. 4 is a sectional view, taken along lines 4—4 of FIG. 3.

Referring then to FIGS. 3 and 4, a plasma etching apparatus according to a second embodiment of the invention will be described in detail.

An etching apparatus 200 according to the second embodiment is substantially identical in structure to the first embodiment except that a compensation gas supply mechanism 202 differs from the compensation gas supply mechanism 136 incorporated in the first embodiment. Therefore, explanation will be mainly given of the compensation gas supply mechanism 202.

As is shown in FIGS. 3 and 4, an annular rail 204 is provided on the insulating support plate 108 of the etching apparatus 200 such that it surrounds the first susceptor 110 with a predetermined space therebetween. The lower end of the rail is fixed on the insulating support plate 108. A gas charge member 206 is provided on the rail 204 such that it can slide along the rail. Thus, as shown in FIG. 4, the gas charge member 206 is in the form of an arcuate box with substantially the same curvature as the rail 204, and has an arcuate groove formed in its lower surface and engaged with an upper portion of the rail 204.

A gas charge chamber 206a is defined in the gas charge member 206. Further, a plurality of small-diameter gas discharge holes 206b are formed at circumferentially regular intervals in the side wall of the gas charge member 206 close to the plasma generating region. As in the first embodiment, the height of the rail 204 and the positions of the gas discharge holes 206b in the gas charge member 206 are set such that the gas discharge holes 206b are situated in vertically center positions with respect to the plasma generating region. A permanent magnet 206c is contained in the portion of the gas charge member 206 close to the magnetic field generating mechanism 124. The magnet 206c can be circumferentially shifted in the gas charge member 206 and be fixed in a predetermined position To this end, the gas charge member 206 may be formed of a magnetic material which can fix the magnet 206c by a magnetic force in a desired position. Alternatively, a member which can mechanically fix the magnet 206c on the gas charge member 206 may be employed. The magnet 206c is located such that the magnetic field generated by it on the magnetic field generating mechanism 124 side has a polarity opposite to that of the magnetic field generated by the mechanism 124 on the gas charge member 206 side. Accordingly, an attracting force is generated between the magnet 206c and the magnetic field generating mechanism 124, and the gas charge member 206 rotates along the rail 204 in accordance with the rotation of the magnetic field generating mechanism 124.

A vertically extending gas supply pipe 208 is contained in a predetermined portion of the rail 204. The lower end of the gas supply pipe 208 extends to the outside of the process container 104 through the bottom wall thereof. The upper surface of the upper end wall of the gas supply pipe 208 is level with the rail 204, and a gas charge port 208a is formed in a center portion of the upper end wall. The lower end of the gas supply pipe 208 is connected to a gas supply source 144 via a gas supply line and a valve 210 provided across the line.

As in the first embodiment, the valve 210 is operably connected to the controller 146, which is connected to the encoder 124a of the magnetic field generating mechanism 124.

A through hole 206d is formed in the bottom wall of the gas charge member 206 such that it will cause the internal space of the gas charge chamber 206a to communicate with the gas charge port 208a of the gas supply pipe 208 when the gas charge member 206 is situated on a predetermined portion of the rail 204, i.e. on the gas supply pipe 208, as will be described later. A one-way valve 206e for opening and closing the through hole 206d is attached to the inner surface of the bottom wall of the gas charge member 206. The one-way valve 206e closes when the gas charge chamber 206a is charged with gas, and opens to permit the introduction of gas from the gas supply 144 into the chamber 206a when the valve 210 on the gas supply 144 side opens. The one-way valve 206e is not necessary where the gas charge member 206 and the rail 204 are constructed such that a lower portion of the member 206 can be engaged with any upper portion of the rail 204 in substantially an airtight manner.

A mechanism for charging the gas charge chamber 206a of the gas charge member 206 with the process gas or etching gas will be described.

In this embodiment, the gas charge chamber 206a is charged with the etching gas before etching wafers. Specifically, the gas charge member 206 is situated such that the through hole 206d is opposed to the gas charge port 208a by stopping the magnetic field generating mechanism 124 in a predetermined position. The position of the gas charge member 206 is calculated by the controller 146 on the basis of a signal generated from the encoder 124a located in the mechanism 124.

After the gas charge member 206 is situated in the predetermined position, the valve 210 is opened by a signal from the controller 146. As a result, the process gas is supplied from the gas supply source 144 into the gas charge chamber 206a via the valve 210, the gas supply pipe 208, the gas charge port 208a and the through hole 206d. At this time, the one-way valve 206e is opened by the pressure of the process gas to be supplied into the gas charge chamber 206a. Thus, the process gas is filled into the gas charge chamber 206a until the pressure in the chamber reaches a predetermined value. In other words, a certain amount of process gas which is necessary in the process chamber 102 at least during the process of wafers is filled into the gas charge chamber 206a. The pressure in the chamber 206a is calculated by the controller 146 on the basis of the pressure in the gas supply pipe 208 sensed by a pressure sensor 208b located therein. When a predetermined amount of process gas is filled into the gas charge chamber 206a, the controller 146 closes the valve 210. When the supply of the process gas is stopped, the driving means in the magnetic field generating mechanism 124 is driven to revolve the magnetic magnet array, thereby generating plasma between the susceptors 110 and 116. While the process gas is filled into the gas charge chamber 206a, part of the process gas may be used to generate the plasma in the process chamber. Alternatively, to generate the plasma, the process gas may be introduced into the process chamber from the gas supply source via a compensation gas supply mechanism with a valve 210a, which is different from the compensation gas supply mechanism 202 and connected to the process chamber as indicated by the broken line in FIG. 3. In this case, the valve 210a is connected to the controller 146, and opened when a signal indicating that the pressure in the process chamber reaches a predetermined value is generated from a pressure sensor provided in the process chamber and connected to the controller 146.

A mechanism for supplying a compensation gas into the plasma generating region will be explained. During the etching process, the magnetic field generating mechanism 124 is rotated, and thus the gas charge member 206 is rotated along the rail 204 in synchronism with the rotation of the mechanism 124. As described in the first embodiment, the gas charge member 206, i.e. each gas discharge hole 206b of the member 206, is situated in the (E×B) direction to discharge gas in a direction opposite to the (E×B) direction. Thus, the process gas filled in the gas charge chamber 206a is discharged to the part of the plasma generating region from the outside thereof through the gas discharge holes 206b.

Since the compensation gas supply mechanism 202 employed in the second embodiment and constructed as above can supply the process gas to that portion of the plasma generating region which has an especially high plasma density, uniform plasma can be generated all over the plasma generating region, like the compensation gas supply mechanism 136 employed in the first embodiment.

Although the preferred embodiments of the invention have been described with reference to the accompanying drawings, the invention is not limited to them. Anyone skilled in the art can conceive various modifications from the technical idea described in the claims. Such modifications are considered to be included in the technical scope of the present invention.

Although in the embodiments, generation of ions is suppressed by diluting a portion of high plasma density with gas to uniform the horizontal plasma density, this is just an example. The portions to which the diluting gas should be supplied depend upon the plasma generating conditions (the intensity of the magnetic field, the frequency or power of the high frequency wave, the temperature or pressure in the process chamber, the kind of gas supplied thereto, etc.), and also upon the conditions of a to-be-treated object. For example, there is a case where gas is supplied in a direction opposite to the (E×B) direction, or a case where gas is supplied to a portion which is situated in a direction deviated from the (E×B) direction or from a direction opposite to the (E×B) direction to thereby uniform the horizontal density of plasma. In other words, in the invention, horizontal nonuniformity in plasma density due to the rotating magnetic field is compensated by supplying a process gas to some portions of the plasma generating region in synchronism with the rotation of the rotating magnetic field.

Further, although in the first embodiment, spaces for temporarily filling gas therein are defined in the gas supply member, the invention is not limited to this structure. The invention can be carried out if, at least, the gas discharge holes formed in the gas supply member are connected to the gas supply pipe.

Moreover, although in the first embodiment, one gas discharge hole is formed in each gas supply member, the invention is not limited to this, but also applicable to a structure in which two or more gas discharge holes are formed in each gas supply member.

In addition, in the first embodiment, the gas charge member is attached to the gas supply pipe extending through the bottom wall into the process container. However, the invention is not limited to this. Even when the gas supply member is attached to a gas supply pipe which extends from the peripheral wall or the upper wall of the process container, the invention can be carried out. Moreover, any gas supply means can be used in the invention if it can supply gas to gas supply members located around the plasma generating region.

Furthermore, although in the first embodiment, the selection of gas discharge holes is performed using a piezoelectric valve, the invention is not limited to this. It suffices if there is provided switching means for switching gas discharge holes in synchronism with the rotation of the magnetic field generating means in order to supply gas to the plasma generating region.

Although in the second embodiment, the rail is provided on the insulating member located on the bottom wall of the process container, the invention is not limited to this, but, for example, may be modified such that the rail extends from the peripheral wall or the upper wall of the process container.

Although in the second embodiment, the magnet is contained in the gas charge member, the invention is not limited to this, but can be carried out using any means if the means can revolve the gas charge member around the plasma generating region. For example, like an electric locomotive, a motor-driven vehicle and a rail are provided for the gas charge member so that the gas charge member can be electrically moved on the rail.

Also, in the second embodiment, the gas charge member is moved on the rail to revolve around the plasma generating region. However, the invention is not limited to this structure, but can be carried out using any means, if the means can revolve the gas charge member around the plasma generating region.

Although in the second embodiment, a plurality of gas discharge holes are formed in the gas charge member, the number of the gas discharge holes is not limited.

Although in the second embodiment, gas supply to the gas charge chamber of the gas charge member is stopped while the member is revolved, the gas supply mechanism may be modified such that gas can be supplemented into the gas charge chamber during the revolution. This mechanism can be achieved by, for example, a structure in which a gas supply groove which communicates with the gas supply pipe is provided on the entire upper surface of the rail, and a substantially annular cover member which closes the gas supply groove but not the gas charge member is provided such that it can revolve together with the gas charge member.

Yet further, in the first and second embodiments, the first and second susceptors are located in the process chamber, and two wafers fixed on these susceptors are treated simultaneously. However, the invention is not limited to this. The invention is also applicable to a case where one or more to-be-treated objects fixed or supported on at least one of upper and lower electrodes are subjected to a plasma process. In this case, a predetermined high frequency power is applied to at least one of the upper and lower electrodes.

Although the first and second embodiments are directed to etching apparatuses for etching wafers, the invention is not limited to this. It is also applicable to various plasma process apparatuses such as a sputtering apparatus, a CVD apparatus, etc., and even to the case of treating, for example, LCD glass substrates. In this case, a predetermined high frequency power is applied to at least one of the upper and lower electrodes.

In addition, the rotating-magnetic-field generating means is not limited to the permanent magnet array employed in the embodiments. It suffices if a rotating magnetic field is generated in the plasma generating region. For example, the magnetic field generating means may consist of a single permanent magnet located in an upper portion of the process container, having north and south poles at its opposite ends, and rotatable about the axis of a wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus comprising:

a process container having a bottom wall, an upper wall, and a peripheral wall located between the bottom and upper walls;

first and second electrodes located in the process container with a space interposed therebetween, a plasma generating region being defined between the first and second electrodes, at least one of the first and second electrodes being disposed to support a to-be-treated object such that the object is opposed to the other electrode;

means for supplying a process gas to the plasma generating region;

means for applying a high frequency voltage to at least one of the first and second electrodes to supply a high frequency power to the plasma generating region;

means for generating a rotating magnetic field in the plasma generating region, wherein the high frequency power and the rotating magnetic field generate plasma of the process gas in the plasma generating region; and compensating-process-gas supply means for supplying a compensating process gas to part of the plasma generating region in synchronism with a rotation of the rotating magnetic field to compensate nonuniformity in a density of plasma generated in the plasma generating region wherein the compensating-process-gas supply means includes a gas supply mechanism which has a plurality of gas discharge holes arranged around the plasma generating region, and gas source means for supplying the compensating process gas to the gas supply mechanism in synchronism with the rotation of the rotating magnetic field, so that the compensating process gas will be sequentially supplied to the plasma generating region through at least one of the gas discharge holes, and wherein the gas supply mechanism has a plurality of gas supply members located in the process container such that said gas supply members surround the plasma generating region, each of the gas supply members including at least one of the gas discharge holes and a gas supply pipe which connects the at least one gas discharge hole to the gas source means; and the gas source means includes a gas supply source, a switching valve connected to the gas supply source, and a plurality of gas supply lines which connect the switching valve to the gas supply pipes, the switching valve being controlled in synchronism with the rotation of the rotating magnetic field such that the compensating process gas is sequentially supplied from the gas supply source to the gas supply pipes via the gas supply lines.

2. A plasma process apparatus according to claim 1, wherein the first and second electrodes support to-be-treated objects such that the objects are opposed to each other, and the compensating-process-gas supply means has a gas supply mechanism for supplying the compensating process gas between the objects.

3. A plasma process apparatus according to claim 2, wherein the gas supply mechanism supplies the compensating process gas to a substantially center point between the objects.

4. A plasma process apparatus according to claim 1, wherein the rotating-magnetic-field generating means has permanent magnet means provided outside the process container and to be revolved so that the rotating magnetic field will be formed parallel to the surface of the to-be-treated object in the plasma generating region, and further comprising control means for detecting the revolution state of the permanent magnet means to thereby control the switching valve.

5. A plasma processing apparatus comprising:

a process container having a bottom wall, an upper wall, and a peripheral wall located between the bottom and upper walls;

first and second electrodes located in the process container with a space interposed therebetween, a plasma generating region being defined between the first and second electrodes, at least one of the first and second electrodes being disposed to support a to-be-treated object such that the object is opposed to the other electrode;

means for supplying a process gas to the plasma generating region;

means for applying a high frequency voltage to at least one of the first and second electrodes to supply a high frequency power to the plasma generating region;

means for generating a rotating magnetic field in the plasma generating region, wherein the high frequency power and the rotating magnetic field generate plasma of the process gas in the plasma generating region; and compensating-process-gas supply means for supplying a compensating process gas to part of the plasma generating region in synchronism with a rotation of the rotating magnetic field to compensate nonuniformity in a density of plasma generated in the plasma generating region, wherein the compensating-process-gas supply means includes a gas charge member having a gas charge chamber to be charged with the compensating process gas, and at least one gas discharge hole for supplying therethrough the compensating process gas to the plasma generating region, and also includes driving means for revolving the gas charge member around the plasma generating region in synchronism with the rotation of the rotating magnetic field.

6. A plasma process apparatus according to claim 5, wherein the rotating-magnetic-field generating means has a magnet array which includes multiple permanent magnets provided on an outer periphery of the process container and to be revolved so that the rotating magnetic field will be formed parallel to a surface of the to-be-treated object in the plasma generating region; and the driving means has a permanent magnet attached to the gas charge member and to be magnetically attracted by the magnet array and revolved in accordance with a revolution of the magnet array.

7. A plasma process apparatus according to claim 5, wherein the compensating-process-gas supply means includes gas source means for supplying the compensating process gas into the gas charge chamber of the gas charge member when the gas charge member stops, and interrupting the supply of the compensating process gas to the gas charge chamber when the gas charge member rotates.

8. A plasma process apparatus according to claim 7, wherein the gas source means includes a gas supply source, a openable/closable valve connected to the gas supply source, and connecting means for connecting the openable/closable valve to the gas charge chamber of the gas charge member, and further comprising control means for detecting a revolution state of the magnet array to control the openable/closable valve.

* * * * *